United States Patent [19]

Cullen et al.

[11] Patent Number: 5,128,734
[45] Date of Patent: Jul. 7, 1992

[54] SURFACE CHANNEL HACT

[75] Inventors: Donald E. Cullen, Manchester; Sears W. Merritt; William J. Tanski, both of Glastonbury; Emilio J. Branciforte, Cromwell; Robert N. Sacks, Glastonbury; Roger D. Carroll, Willimantic, all of Conn.

[73] Assignee: United Technologies Corporation, Hartford, Conn.

[21] Appl. No.: 591,656

[22] Filed: Oct. 2, 1990

[51] Int. Cl.⁵ .................................... H01L 29/78
[52] U.S. Cl. ............................... 357/24; 357/16; 310/313 R; 310/338; 333/152
[58] Field of Search .................. 357/24, 24 M, 16; 310/338, 313 R, 313 B, 313 D, 313 C, 313 A; 333/152

[56] References Cited

U.S. PATENT DOCUMENTS

| 3,654,499 | 4/1972 | Smith | 307/304 |
|---|---|---|---|
| 4,354,166 | 10/1982 | Grudkowski | 333/152 |
| 4,499,440 | 2/1985 | Grudkowski | 357/26 |
| 4,633,285 | 12/1986 | Hunsinger et al. | 357/24 |
| 4,668,971 | 5/1987 | Hynecek | 357/24 |
| 4,884,001 | 11/1989 | Sacks et al. | 357/26 |
| 4,893,161 | 1/1990 | Tanski et al. | 357/24 |
| 4,894,689 | 1/1990 | Cooper et al. | 357/3 |
| 4,980,596 | 12/1990 | Sacks et al. | 310/313 D |
| 4,990,814 | 2/1991 | Tanski et al. | 310/313 D |
| 4,994,772 | 2/1991 | Ballato | 357/24 |

OTHER PUBLICATIONS

Appl. Phys. Lett. 4(4), 15 Aug. 1982, "Charge Transport by Surface Acoustic Waves in GaAs", by Hoskins et al., pp. 332-334.

Primary Examiner—Rolf Hille
Assistant Examiner—Steven Loke

[57] ABSTRACT

A simplified heterostructure charge transport device has a GaAs transport layer that is the top layer of the device, deposited on an (Al,Ga) As barrier layer for vertical confinement of charge packets. Confinement at the top surface is provided by pinning of the conduction band surface states.

5 Claims, 2 Drawing Sheets

SURFACE CHANNEL HACT

TECHNICAL FIELD

The field of the invention is that of surface acoustic wave (SAW) devices on GaAs, in particular, that of heterostructure acoustic charge transport (HACT) devices.

BACKGROUND ART

It is known to construct an acoustic charge transport (ACT) delay line using a SAW transducer to launch an acoustic wave through a piezoelectric slab semiconductor. FIG. 2 illustrates a sketch of one such prior art device, in which GaAs layer 10 carries the SAW and layer 10 is positioned above a thick substrate layer 20, also of GaAs. Vertical charge confinement is provided by electrodes 150 and 160 with voltages $V_A$ and $V_B$ applied.

FIG. 3 illustrates another prior art device, a heterostructure acoustic charge transport (HACT) device, in which the charge transport channel 225 corresponding to channel 10 in FIG. 2, is sandwiched between two layers 230 and 220 of (Al,Ga)As. This last device, illustrated in U.S. Pat. No. 4,893,161, uses the semiconductor band structure properties of upper and lower confinement or barrier layers to provide vertical charge confinement.

DISCLOSURE OF INVENTION

The invention relates to an acoustic charge transport device in which charge confinement is effected by a one-sided heterostructure, having a barrier layer of (Al,Ga)As below a thin charge transport layer of GaAs, and an upper barrier formed by electrons trapped in surface states in the surface of the charge transport layer.

Other features and advantages will be apparent from the specification and claims and from the accompanying drawings which illustrate an embodiment of the invention.

BEST MODE FOR CARRYING OUT THE INVENTION

Figure 2:
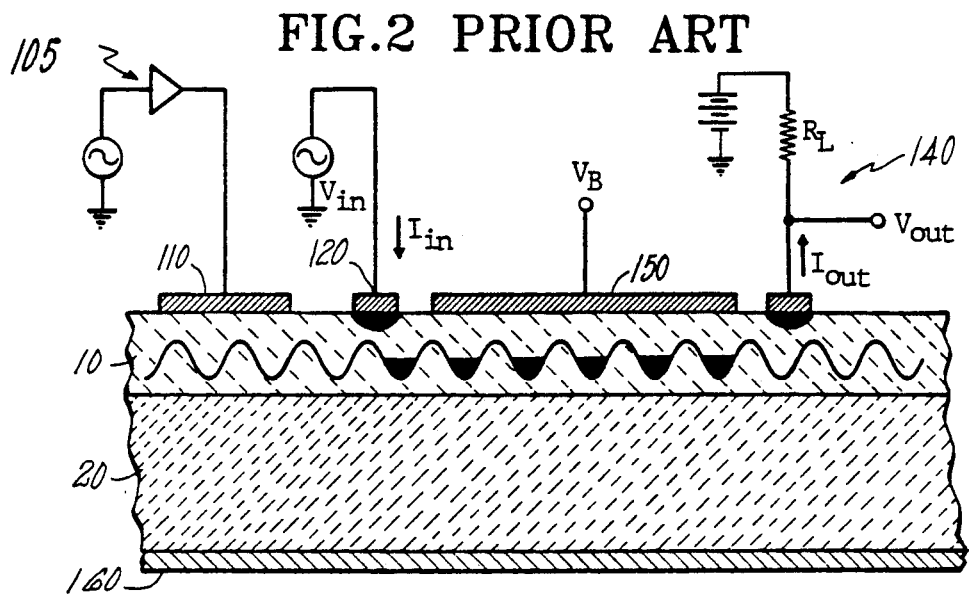
FIG. 2 illustrates a prior art ACT device.
Figure 3:
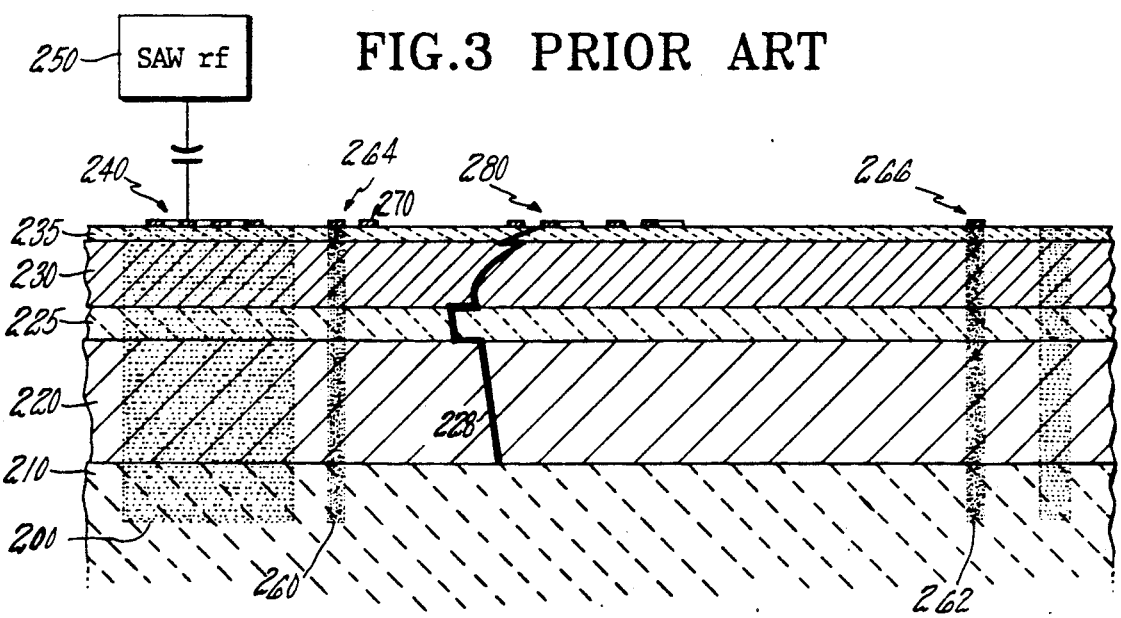
FIG. 3 illustrates a prior art HACT device.

Those skilled in the art are well aware that the HACT device illustrated in FIG. 3 provides advantages compared to that of the prior art ACT device illustrated in FIG. 2. The device in FIG. 2 requires the use of electrodes 150 and 160 to confine the charge vertically in the drawing, perpendicular to the direction of propagation of the SAW. In the HACT device of FIG. 3, confinement is provided by means of a potential well resulting from electronic band structure differences between a GaAs charge transport layer 225 and bounding (Al,Ga)As confinement 230 and 220 layers above and below.

Figure 1:
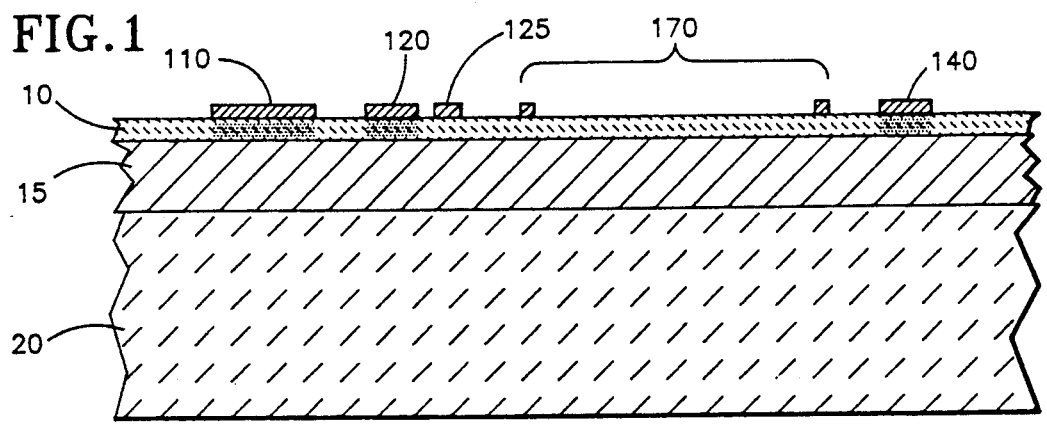
FIG. 1 illustrates an embodiment of the device in cross section.

Referring now to FIG. 1, there is illustrated an embodiment of the device in which the same substrate 20 supports a lower (Al,Ga)As barrier layer 15. The top thin GaAs charge transport layer 10, silicon doped with a concentration of $1-5 \times 10^{17}/cm^3$ is in direct contact with a set of electrodes including signal tap electrodes 170. The SAW generator electrodes 110, the source electrode 120 for electrons, the charge control electrode 125 and the sink or output electrode 140 for electrons removed from the charge transport layer are all the same as their FIG. 3 prior art counterparts 240, 264, 270, and 266.

There is a set of tap electrodes 170 located in the same area as electrode 150 of FIG. 2, which are be used to sense the charge packets as they flow along charge transport layer 15. In the case where the device is used as a delay line, electrodes 170 will not be necessary. This sensing involves no flow of electrons from layer 10, being accomplished by capacitive coupling. The electrodes 110, 125, and 170 are Schottky diodes formed by the deposition of a metal, such as aluminum, directly onto the GaAs top layer. The other electrodes, 120 and 140, are ohmic, having an ohmic contact into the charge transport layer for conduction of electrons. In contrast to the device of FIG. 2, charge transport layer 10 is relatively thin, having a thickness on the order of 1,000 Å.

In the prior art of FIG. 2, the SAW wave was shorted out at the surface of that device by the large electrode 150, it was therefore necessary to shift the electrons down to a depth where the SAW was adequate to transport them. This resulted in a layer typically having a thickness of about one half of the SAW wavelength, typically between 2 microns (for a SAW frequency of ~600 MHz.) and 5 microns (300 MHz.) Thicker layers are difficult to fabricate, resulting in an effective lower limit of SAW frequency of about 300 MHz for these devices. The prior art device of FIG. 2 also depended on bias fields set up between the electrodes 150 and 160 in order to confine electrons vertically within the thick transport layer.

The device of FIG. 1 differs from the device of FIG. 3, which is also a heterostructure device, in that the device of FIG. 3 has two (Al,Ga)As layers with their associated fabrication complexity and displacement of the charge packets from the electrodes. It has been discovered that the pinning of the conduction potential by surface states on the top surface of layer 10 is sufficient to provide confinement, so that the upper confinement layer 230 and the cap layer 235 are replaced by the single layer 10, having a thickness comparable to that of layer 225, and the signal coupling can be improved, since the electron packets are closer to the tap electrodes.

Figure 4:
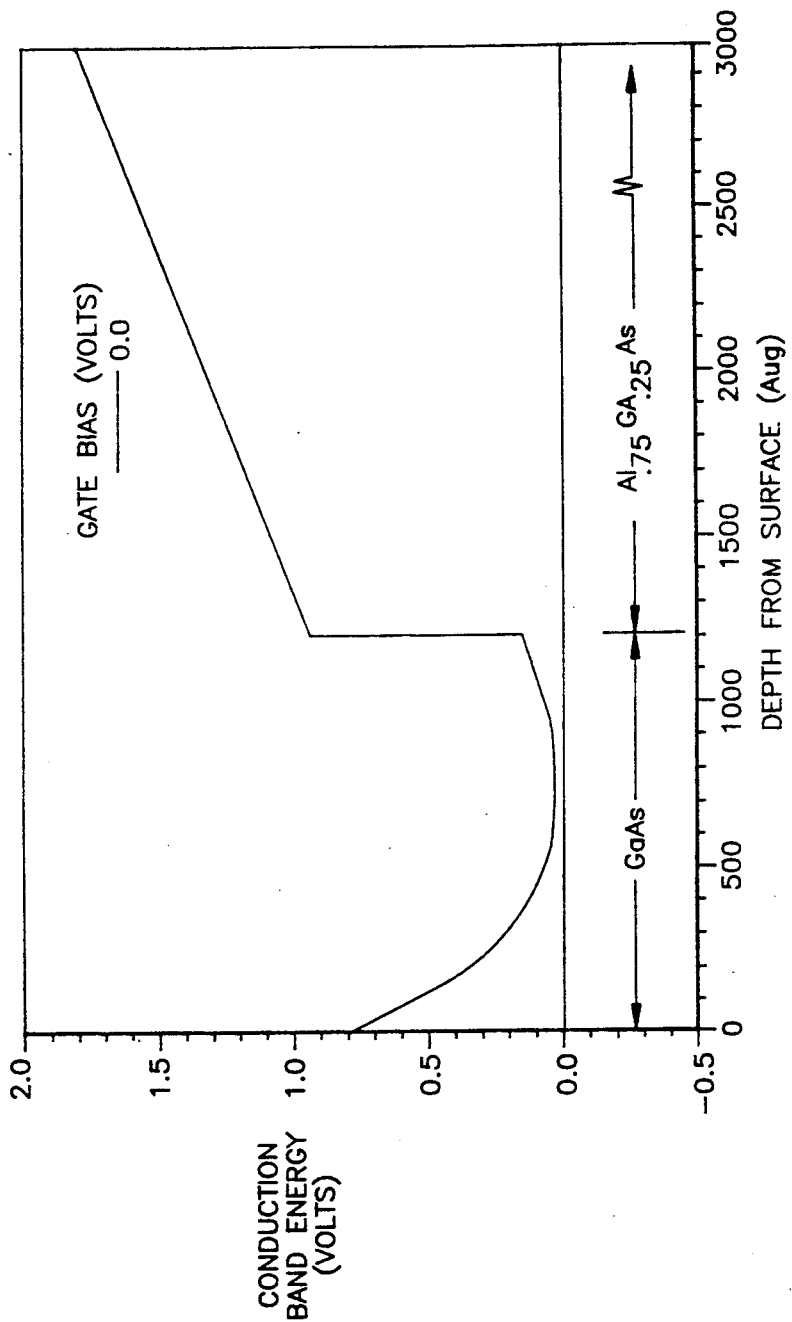
FIG. 4 illustrates the potential well formed in the embodiment of FIG. 1.

Referring now to FIG. 4, there is illustrated a graph showing the conduction band energy or potential for the conduction band versus the depth below the top surface of layer 10 and layer 15. The Y axis shows the conduction band energy in both layers while the X axis shows the depth below the surface in angstroms. On the left edge of the graph, the potential rises towards a value of 0.8 volts which results from the pinning effect described above. At the intermediate straight line, which is the boundary between the GaAs layer 10 and the AlGaAs layer 15, there is a sharp rise to a value of 1 volt, determined by the barrier layer composition. The composition of layer 15 is 75% aluminum and 25% gallium in this embodiment. This composition is not critical and has been tested for Al concentration in the range 20%-75%. Those skilled in the art will readily be able to devise a number of different compositions suitable for their needs.

The depth or thickness of layer 10 in this embodiment is 1200 angstroms, but that depth is not critical. It is necessary for the depth to exceed some minimum amount, 500 angstroms say, in order to avoid excessive interaction between the surface electrodes 170 and the charged packets. If the layer is too thin, the electrons will tunnel into the electrodes and under the influence of the SAW will jump from electrode to electrode rather than traveling through the body of the GaAs. On the other hand, if the layer is too thick, much beyond 2,000 angstroms, say, there are other adverse effects, such as poor charge control efficiency, since the vertical position of the electrons is not adequately defined. The thickness of the charge transport layer will be a trade-off between the desire for a thin layer and the need to control the vertical position of the electron packets.

It will be evident to those skilled in the art, in the light of this disclosure, that this device has advantages in signal coupling and frequency response compared with other devices. It is preferable for short or small delay times for the transit between the source and the sink electrode, in the range of about 2 microseconds or less, since the device is inherently subject to perturbation of the SAW and/or perturbation of the charge packets by the strong interaction with the electrodes. The fewer the number of tap electrodes, the longer the device can be without excessive interaction between electron packets and the electrodes. As a pure delay line, for example, one that has no tap electrodes 170, it will be possible to have lengths of 10 microseconds.

It should be understood that the invention is not limited to the particular embodiments shown and described herein, but that various changes and modifications may be made without departing from the spirit and scope of this novel concept as defined by the following claims.

We claim:

1. A heterostructure acoustic charge transport device formed above a semiconductor substrate, comprising:
   a barrier layer of predetermined composition and having a conduction band with a first barrier potential disposed above said semiconductor substrate;
   a charge transport layer of predetermined composition and thickness and having a charge transport conduction band potential lower in magnitude than said barrier conduction band potential, disposed in contact with said barrier layer at a lower face and having a top surface opposite said lower face, said top surface having surface states therein, whereby said charge transport conduction band potential is pinned at said surface by said surface states;
   a set of electrodes disposed on said top surface, comprising at least a source electrode for injecting electrons into said charge transport layer and a sink electrode removing electrons from said charge transport layer but excluding a confinement electrode for confining charge in said charge transport layer; and
   means for generating a surface acoustic wave travelling along a first axis in said charge transport layer passing through said source and sink electrodes, whereby electrons injected into said charge transport layer from said source electrode are carried by said surface acoustic wave toward said sink electrode.

2. A charge transport device according to claim 1, in which said charge transport layer is composed of GaAs and said barrier layer is composed of (Al,Ga) As.

3. A charge transport device according to claim 2, in which said charge transport layer has a thickness of less than 2,000 Å.

4. A charge transport device according to claim 1, in which said set of electrodes includes a plurality of signal detection electrodes in contact with said top surface and forming Schottky diodes therewith, whereby signals are coupled into said signal detection electrodes by the passage of said electrons through said charge transport layer.

5. A charge transport device according to claim 4, in which said charge transport layer has a thickness of less than 2,000 Å.

* * * * *

UNITED STATES PATENT AND TRADEMARK OFFICE
CERTIFICATE OF CORRECTION

PATENT NO. : 5,128,734

DATED : July 7, 1992

INVENTOR(S) : Donald E. Cullen et al

It is certified that error appears in the above-identified patent and that said Letters Patent is hereby corrected as shown below:

Column 4, line 15, after "electrode", insert --for--.

Signed and Sealed this

Twenty-fourth Day of August, 1993

Attest:

BRUCE LEHMAN

Attesting Officer    Commissioner of Patents and Trademarks